(12) United States Patent
Steffas

(10) Patent No.: US 10,209,136 B2
(45) Date of Patent: Feb. 19, 2019

(54) FILAMENT TEMPERATURE DERIVATION IN HOTWIRE SEMICONDUCTOR PROCESS

(71) Applicant: Applied Materials, Inc., Santa Clara, CA (US)

(72) Inventor: Paul Steffas, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 926 days.

(21) Appl. No.: 14/501,902

(22) Filed: Sep. 30, 2014

(65) Prior Publication Data

US 2015/0112631 A1    Apr. 23, 2015

Related U.S. Application Data

(60) Provisional application No. 61/894,677, filed on Oct. 23, 2013.

(51) Int. Cl.
| | |
|---|---|
| *G01K 7/16* | (2006.01) |
| *G01K 13/00* | (2006.01) |
| *C23C 16/52* | (2006.01) |
| *B05B 12/08* | (2006.01) |
| *C23C 16/448* | (2006.01) |

(Continued)

(52) U.S. Cl.
CPC ............ *G01K 7/16* (2013.01); *B05B 12/08* (2013.01); *C23C 16/4488* (2013.01); *C23C 16/52* (2013.01); *G01K 13/00* (2013.01); *B05B 17/04* (2013.01); *G01K 2217/00* (2013.01); *H01L 21/67248* (2013.01)

(58) Field of Classification Search
CPC .......... G01K 7/16; G01K 13/00; G01N 27/00
See application file for complete search history.

(56) References Cited

U.S. PATENT DOCUMENTS

| | | | | |
|---|---|---|---|---|
| 4,918,974 A | * | 4/1990 | Hachey | G01N 27/185 73/19.07 |
| 6,369,580 B1 | * | 4/2002 | Takashima | G01R 31/2812 324/500 |
| 6,723,140 B2 | | 4/2004 | Chu et al. | |

(Continued)

FOREIGN PATENT DOCUMENTS

WO    2007/002376 A2    1/2007

OTHER PUBLICATIONS

Cees Dekker; Physics Today; Carbon Nanotubes as Molecular Quantum Wires dated May 1999; 9 total pages.

*Primary Examiner* — Mohamed Charioui
(74) *Attorney, Agent, or Firm* — Patterson + Sheridan LLP

(57) ABSTRACT

The present disclosure provides apparatus and methods for monitoring and controlling filaments used in hotwire semiconductor processing and for monitoring integrity of filaments in a hotwire processing chamber. Embodiments of this disclosure may use real time voltage and current feedback signals provided by the power supply, known attributes, for example resistivity, of filament, filament geometries, for example diameter and length, and filament assembly configurations as input, to derive filament temperature in real time. Embodiments of the present disclosure are capable of continuously derive accurate temperatures of the filament assembly in a hotwire processing chamber after the filament assembly has changed geometries due to normal usage by using the measured cold resistance of the wire periodically before the process starts.

15 Claims, 5 Drawing Sheets

(51) Int. Cl.
  *B05B 17/04*  (2006.01)
  *H01L 21/67*  (2006.01)

(56) References Cited

U.S. PATENT DOCUMENTS

| | | |
|---|---|---|
| 6,737,197 B2 | 5/2004 | Chu et al. |
| 6,824,755 B2 | 11/2004 | Colbert et al. |
| 7,070,632 B1 | 7/2006 | Visco et al. |
| 7,160,531 B1 | 1/2007 | Jacques et al. |
| 7,183,229 B2 | 2/2007 | Yamanaka |
| 7,338,202 B1 * | 3/2008 | Kapat ............... B81C 1/0069 374/10 |
| 8,526,167 B2 | 9/2013 | Pushparaj et al. |
| 2004/0258997 A1 | 12/2004 | Utsugi et al. |
| 2006/0063074 A1 | 3/2006 | Jenson et al. |
| 2006/0113193 A1 | 6/2006 | Rasmussen |
| 2006/0185595 A1 | 8/2006 | Coll et al. |
| 2007/0194467 A1 | 8/2007 | Yang et al. |
| 2009/0176159 A1 | 7/2009 | Zhamu et al. |
| 2009/0186276 A1 | 7/2009 | Zhamu et al. |
| 2009/0197014 A1 * | 8/2009 | Wu ..................... C23C 16/27 427/569 |
| 2011/0132398 A1 * | 6/2011 | Barrett ................ G01F 1/6845 134/6 |
| 2012/0021199 A1 * | 1/2012 | Koike ................ C23C 14/0617 428/216 |
| 2012/0120982 A1 * | 5/2012 | Anaya-Dufresne .... G11B 5/607 374/141 |

* cited by examiner

FILAMENT TEMPERATURE DERIVATION IN HOTWIRE SEMICONDUCTOR PROCESS

CROSS-REFERENCE TO RELATED APPLICATIONS

This application claims priority to U.S. Provisional Patent Application Ser. No. 61/894,677, filed on Oct. 23, 2013, which herein is incorporated by reference.

BACKGROUND

Field

Embodiments of the present disclosure generally relate to apparatus and methods for monitoring and controlling filaments used in hotwire semiconductor processing.

Description of the Related Art

Hotwire semiconductor processes generally involve decomposing precursor gases on heated filaments. For example, in hotwire chemical vapor deposition (HWCVD) and hotwire etch, radical species in the decomposed precursor gases often react in the gas phases and deposit onto or etch into a heated substrate.

During hotwire processes, hotwire temperature, among others, is usually monitored and controlled to obtain desired process quality. However, determining temperature of the hotwire filament is challenging because of the temperature range of the filament is high, e.g. higher than 1500° C., and morphology of the filament assembly. Infrared pyrometry and thermocouples are conventionally used for the measuring temperature of the hotwire filament. However, infrared pyrometry is not only costly but also prone to inaccuracy because the infrared pyrometers are unable to capture the temperature of the entire filament assembly. Thermocouples also cannot achieve accurate temperature measurement because thermocouples can only measure a limited number of measuring points where isolation and sensitive manual placement requirement can be satisfied.

Therefore, there is a need for improved temperature measurement for hotwire filaments.

SUMMARY

The present disclosure generally to apparatus and methods for monitoring and controlling filaments used in hotwire semiconductor processing.

One embodiment of the present disclosure provides a method for monitoring real time temperature in a hotwire processing chamber. The method includes obtaining a resistance-temperature relationship of a filament assembly in the hotwire processing chamber, monitoring a real time voltage and a real time current of a power supply connected to the filament assembly while the power supply provides electrical power to the filament assembly, calculating a real time resistance of the filament assembly from the real time voltage and the real time current of the power supply, and determining a real time temperature of the filament assembly according to the real time resistance and the resistance-temperature relationship.

Another embodiment of the present disclosure provides a hotwire processing chamber. The hotwire processing chamber includes a chamber body defining an internal processing volume, a filament assembly disposed in the internal processing volume, a power supply coupled to the filament assembly, and a temperature controller coupled to the power supply. The temperature controller monitors a real time voltage and a real time current of the power supply, calculates a real time resistance of the filament assembly from the real time voltage and the real time current of the power supply, and determines a real time temperature of the filament assembly according to the real time resistance and a resistance-temperature relationship.

One embodiment of the present disclosure provides a method for detecting breakage in a filament assembly of a hotwire processing chamber. The method includes observing a change of a feedback signal of a power supply coupled to the filament assembly while the power supply is providing electrical power to the filament assembly, and determining whether a breakage occurs according to a slope of the change of the feedback signal.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure provides apparatus and methods for monitoring and controlling filaments used in hotwire semiconductor processing. The present disclosure also includes apparatus and methods for monitoring integrity of filaments in a hotwire processing chamber.

Embodiments of this disclosure may be implemented in form of software operating in a standalone controller or an existing chamber controller. The software according to embodiments of this disclosure may use real time voltage and current feedback signals provided by the power supply, known attributes, for example resistivity, of filament, filament geometries, for example diameter and length, and filament assembly configurations as input, to derive filament temperature in real time. Embodiments of the present disclosure are capable of continuously derive accurate temperatures of the filament assembly in a hotwire processing chamber after the filament assembly has changed geometries due to normal usage by using the measured cold resistance of the wire periodically before the process starts.

Embodiments of the present disclosure also provide a method to identify the occurrence of a single failed filament among an array of filaments used in a hotwire semiconductor process chambers.

Figure 1:
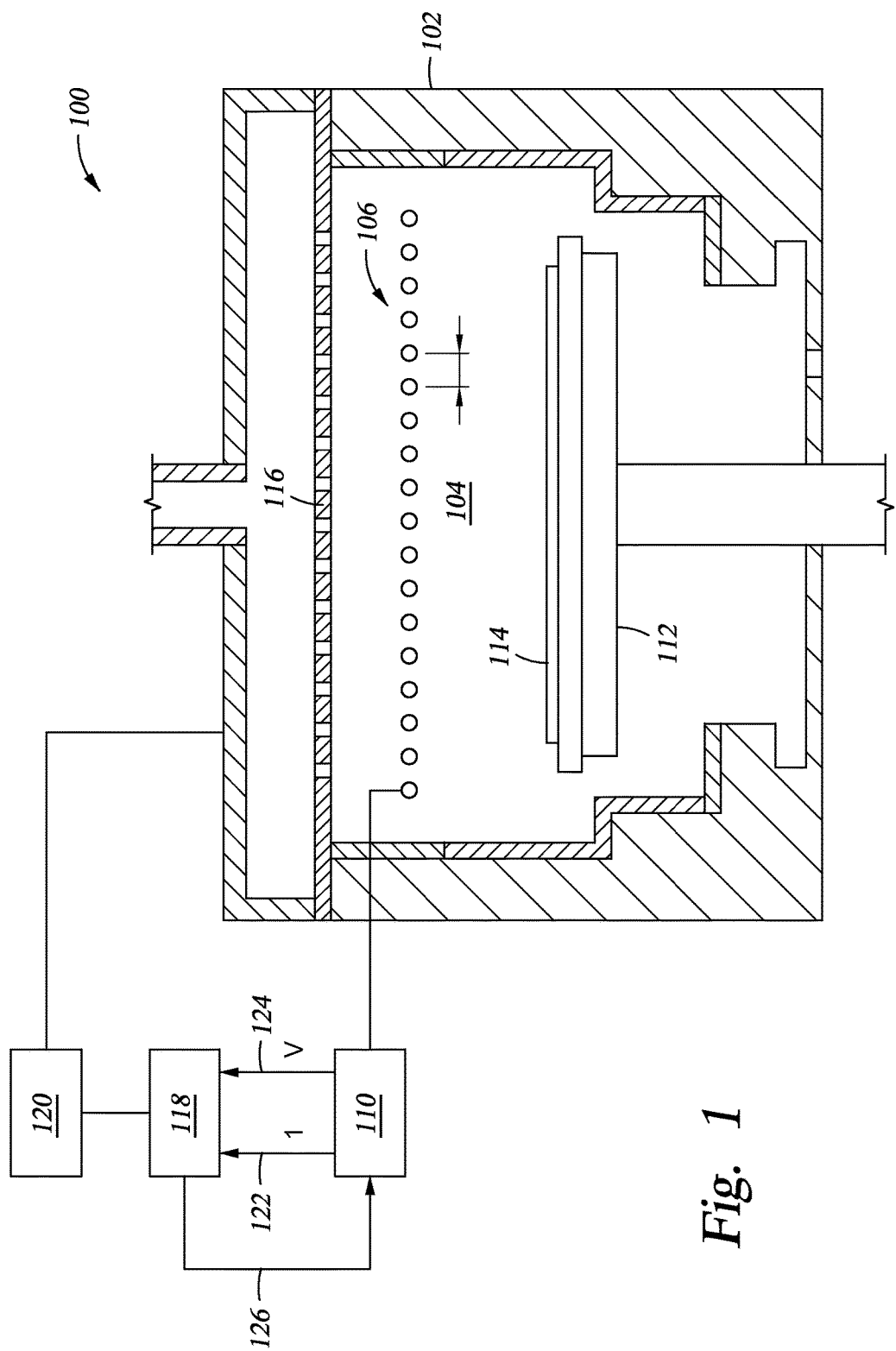
FIG. 1 is a schematic view of a hotwire processing chamber according to one embodiment of the present disclosure.

FIG. 1 is a schematic view of a hotwire processing chamber 100 according to one embodiment of the present disclosure. The hotwire processing chamber 100 may be configured to perform HWCVD or hotwire etch. The hotwire processing chamber 100 includes a chamber body 102 having an internal processing region 104. A substrate support 112 may be disposed in the internal processing region 104 for supporting a substrate 114 during processing. A showerhead assembly 116 may be disposed over the substrate support 112 for evenly distributing one or more processing gases to the internal processing region 104 during processing.

A filament assembly 106 is disposed in the internal processing region 104 between the showerhead 116 and the substrate support 112. The filament assembly 106 may include a plurality of filaments 108 distributed across the internal processing region 104 over the substrate support 112. The plurality of filaments 108 collectively form a heat source to provide a desired temperature to facilitate a process in the hotwire processing chamber 100. The filaments 108 may be any suitable resistive heating element. In one embodiment, the filaments 108 may be formed from tantalum (Ta) or tungsten (W). Alternatively, the filament assembly 106 may include a single wire filament routed back and forth across the internal processing region 104.

A power supply 110 may be coupled to the plurality of filaments 108 to provide electrical current to heat up the plurality of filaments 108. The plurality of filaments 108 may be coupled in parallel, in series, or in combination of parallel and series to the power supply 110. In one embodiment, the power supply 110 may be a direct current (DC) power supply. The power supply 110 may include two or more DC power supplies connected in series or in parallel.

The hotwire processing chamber 100 further includes a temperature controller 118 coupled to the power supply 110. The temperature controller 118 is configured to monitor the temperature of the plurality of filaments 108 by monitoring and analyzing one or more attributes of the power supply 110 and controlling the temperature of the filaments 108 by sending control signals to the power supply 110. In one embodiment, the temperature controller 118 may be connected to the power supply 110 by at least one current feedback 122, at least one voltage feedback 124, and a control output 126.

Figure 2:
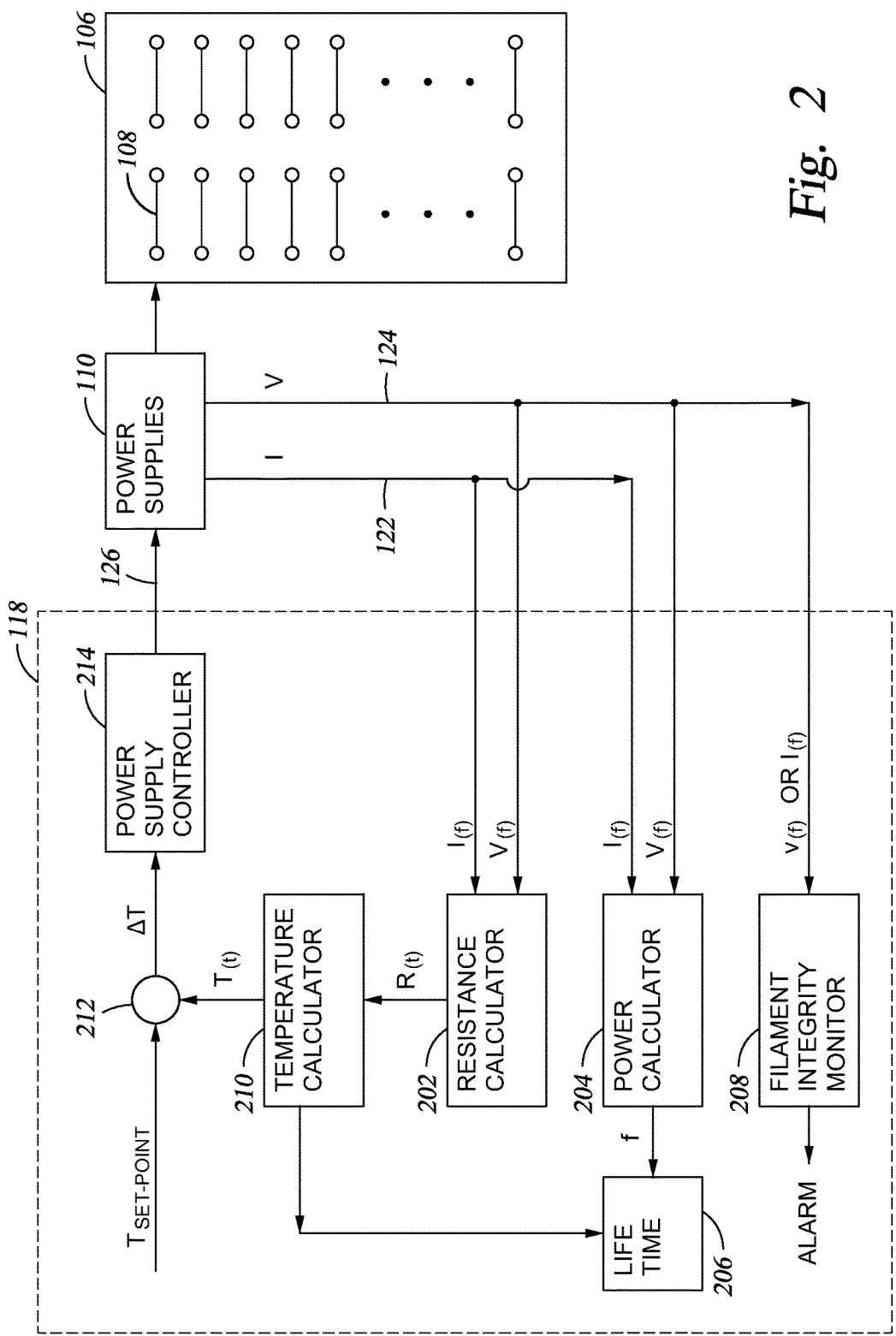
FIG. 2 is a schematic block diagram of showing a temperature control and integrity diagnostics for a hotwire filament assembly according to one embodiment of the present disclosure.

FIG. 2 is a schematic block diagram of showing the temperature controller 118 according to one embodiment of the present disclosure. The temperature controller 118 may include a resistance calculator 202 which receives the current feedback 122 and the voltage feedback 124 from the power supply 110. The resistance calculator 202 may sample the current feedback 122 and voltage feedback 124 at a predetermined time interval to obtain discrete current and voltage values $V_{total}(t)$ and $I_{total}(t)$ and calculate the real time resistance $R_{total}(t)$ of the load, which is the filament assembly 106, of the power supply 110. The real time resistance $R_{total}(t)$ may be calculated by:

$$R_{total}(t) = \frac{V_{total}(t)}{I_{total}(t)} \quad \text{Equation 1}$$

The real time resistance $R_{total}(t)$ represents the resistance of the filament assembly 106 in its entirety. Resistance of individual filament 108 can be derived from the real time resistance $R_{total}(t)$ according to the connections of the plurality of filaments 108.

The real time resistance $R_{total}(t)$ calculated in the resistance calculator may be forward to a temperature calculator 210. The temperature calculator 210 may derive a real time temperature T(t) according to a pre-established resistance-temperature relationship. Although not bound by theory, the inventor noted that resistance of resistors often changes with temperature. The particulars of resistance changing with temperature for a filament may be captured in the resistance-temperature relationship, which may be used to determine the temperature of the filament when the resistance of the filament is obtained. The pre-established resistance-temperature relationship may be equation of a filament temperature in term of filament resistance. In one embodiment, the pre-established resistance-temperature relationship is a linear equation of the filament temperature in term of filament resistance. In another embodiment, the pre-established resistance-temperature relationship may be a look-up table of filament temperature and filament resistance. The real time temperature T(t) may be real time temperature of individual filament 108 or real time temperature of the filament assembly 106 as a whole. TABLE I below is an exemplary look-up table showing the resistance-temperature relationship of the filament assembly as a whole.

TABLE I

| $I_{total}$ Current (Amps) | $V_{total}$ Volts | $R_{total}$ Resistance (Ohms) | $T_{total}$ Filament Temp (C.) |
|---|---|---|---|
| 0.00 A | 0.0 V | 0.579 | 25.0 |
| 5.14 A | 6.5 V | 1.263 | 425.1 |
| 15.12 A | 32.3 V | 2.139 | 917.6 |
| 20.08 A | 48.5 V | 2.417 | 1109.8 |
| 25.01 A | 66.5 V | 2.659 | 1298.6 |
| 29.98 A | 86.4 V | 2.882 | 1516.8 |
| 34.95 A | 107.6 V | 3.079 | 1647.8 |
| 39.93 A | 129.8 V | 3.251 | 1793.2 |
| 44.50 A | 148.6 V | 3.339 | 1830.8 |
| 47.10 A | 160.7 V | 3.412 | 1931.1 |

The real time temperature T(t) derived by the temperature calculator 210 may be sent to an error checker 212, where the real time temperature T(t) is compared with a target temperature $T_0$. The target temperature $T_0$ may be a pre-set temperature determined by the process being performed. A temperature error $\Delta T$ may be obtained by comparing the real time temperature T(t) and the target temperature $T_0$.

The temperature error $\Delta T$ is then sent to a power supply controller 214. The power supply controller 214 may be configured to send the control signal 126, for example in terms of voltage and/or current, to the power supply 110 to achieve a desired temperature in the filaments 108. The temperature error $\Delta T$ may be monitored and analyzed to determine whether it is necessary to correct the error. When the temperature error $\Delta T$ is greater in value that a threshold value, the power supply controller 214 may adjust the control signal 126 to correct the error.

The temperature controller 118 may also include other diagnostic functions. In one embodiment, the temperature controller may include a power calculator 204. The power calculator 204 may receive and sample the current feedback 122 and the voltage feedback 124 from the power supply 110 at a predetermined time interval, and calculate a real time power output P(t) by:

$$P(t)=V_{total}(t) \cdot I_{total}(t). \quad \text{Equation 2}$$

The real time power output P(t) may be forward to a life time monitor 206. The life time monitor 206 may also receive real time temperature T(t) from the temperature calculator 210.

In one embodiment, the life time monitor 206 may provide filament life time prediction according to accumulative hours of the filaments 108 at different temperatures and at peak power level. The life time monitor 206 may send a warning when the life time prediction reaches a threshold value.

In one embodiment, the temperature controller 118 may include a filament integrity monitor 208. The filament integrity monitor 208 may receive and sample the voltage feedback 124 from the power supply 110 at a predetermined time interval, and monitoring a time derivate or a slope of the voltage feedback dV(t)/dt. A large value of the time derivate of voltage feedback dV(t)/dt may indicate that a sudden disturbance has occurred in the filament assembly. When the time derivate of voltage feedback dV(t)/dt exceeds a threshold value and the change in V(t) exceeds a threshold magnitude, the filament integrity monitor 208 may send out a warning signal indicating a breakage in the filaments 108 to trigger necessary response. Similarly, the filament integrity monitor 208 may monitor and analyze the time derivative of current feedback dI(t)/dt to determine whether a breakage has occurred.

In one embodiment, a specific tolerance of temperature non-uniformity may be chosen to determine whether to continue or terminate the processing for maintenance when the filament integrity monitor 208 indicates that the filament assembly may have a single failure. In one embodiment, software performing a method according to embodiments of the present disclosure may determine whether a single failure or "open circuit" has occurred within the array of filaments when a sudden change occurs in the array of filaments causing sudden disturbance in current and/or voltage of the power supply.

The temperature controller 118 may be implemented in form of software in a standalone controller or incorporated with an existing controller of a hotwire processing chamber.

Figure 3:
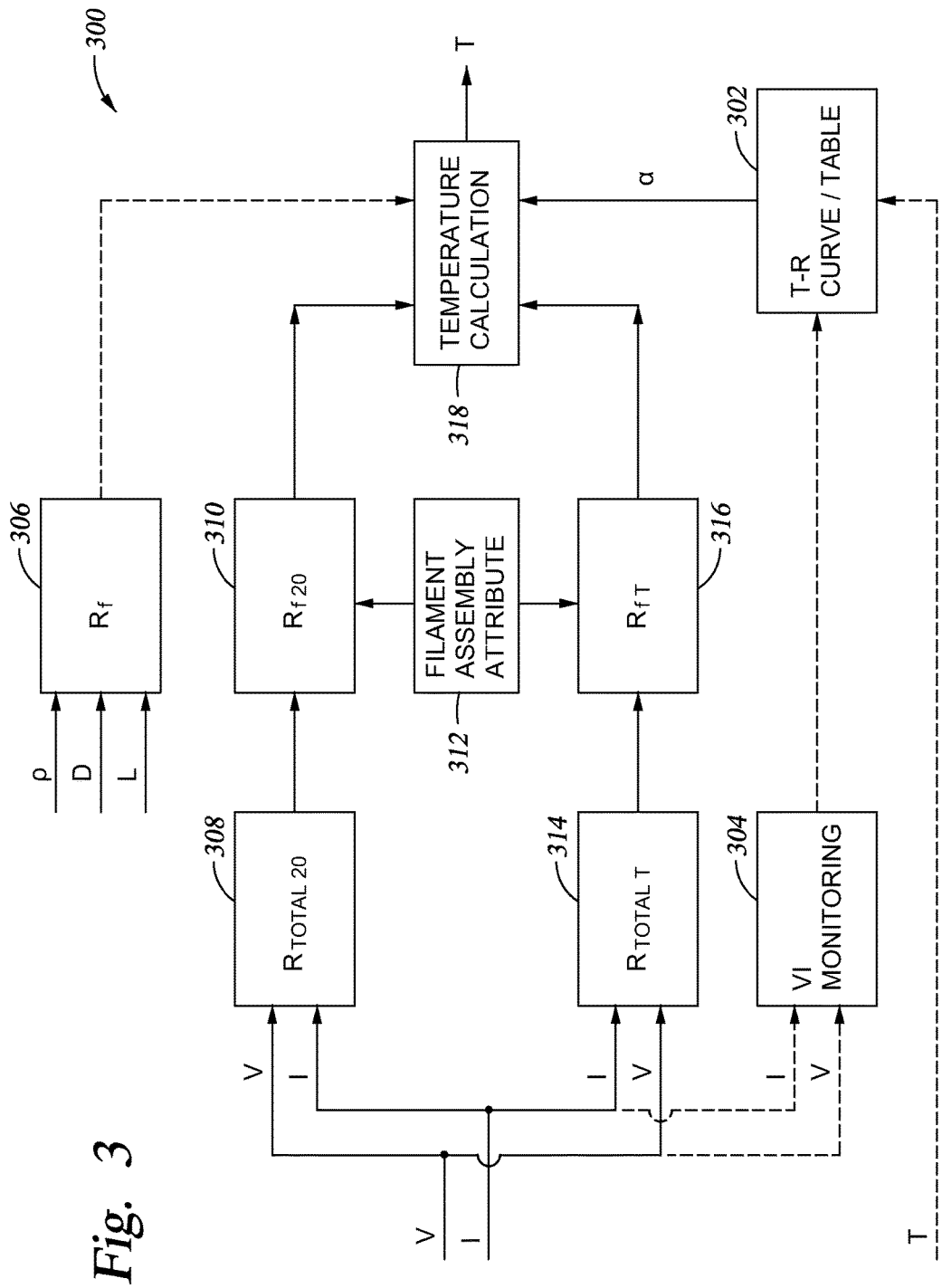
FIG. 3 is a schematic block diagram showing real time temperature monitoring mechanism according to one embodiment of the present disclosure.

FIG. 3 is a schematic block diagram showing a real time temperature monitoring mechanism 300 according to one embodiment of the present disclosure. The temperature monitoring mechanism 300 may be used in the resistance calculator 202 and temperature calculator 210 of the temperature controller 118.

The temperature monitoring mechanism 300 includes a temperature-resistance curve/table 302 to be used in temperature calculation. The temperature resistance curve/table 302 may be established during an initiation process. In the initiation process, temperatures of a filament may be measured by a temperature sensor, such as a thermal couple, while the filament positioned in a processing environment is powered at different voltage levels. For example, the filament may be powered incrementally at different voltage levels. The power supply may maintain at each voltage level for predetermined time duration so that the filament reaches a steady state. As the filament reaches a steady state at each power level, voltage and current may be measured, and the temperature of the filament may be measured using any known methods. The voltage and current of the filament may be measured by observing feedbacks for the power supply, using a voltage current monitoring block 304. The temperature of the filament may be measured using a thermocouple. A resistance of the filament may be calculated from each pair of measured voltage and current. A temperature-resistance curve/table 302 can be developed when resistances and temperatures at multiple power levels are measured. The temperature-resistance curve/table 302 may be a look up table or an equation. In one embodiment, the temperature-resistance curve/table 302 includes a linear approximation developed from the measured values of temperature and resistance:

$$R_{T_2}=R_{T_1}+\alpha*(T_2-T_1) \quad \text{Equation 3}$$

where $T_2$ and $T_1$ are two different temperatures, $R_{T_2}$ and $R_{T_1}$ are resistances of the filament corresponding to temperatures $T_2$ and $T_1$ respectively, and $\alpha$ is a temperature coefficient obtained by empirical methods. For tantalum filaments, the temperature coefficient $\alpha$ may be about $6.62 \times 10^{-4}/°$ C.

The temperature monitoring mechanism 300 also includes an original resistance block 306, where theoretical resistance $R_0$ of the filament can be calculated according to physical attributes of the filament, such as length L (in mm), diameter D (in mm), and resistivity $\rho$ (in ohm·mm) of the filament material. The theoretical resistance may be used to monitor any drift of resistance during the life time of the filament. The theoretical resistance of a filament at room temperature is:

$$R_0=\rho*L/D. \quad \text{Equation 4}$$

The temperature monitoring mechanism 300 may also include a cold resistance monitor 308. The cold resistance monitor 308 calculates the resistance of the filament at room temperature, about 20° C. The calculation may be performed by monitoring the current and voltage of the power supply coupled to the filament immediately after the filament is powered up and before the filament has time to heat up. In one embodiment, the cold resistance monitor 308 provides a resistance of a filament assembly $R_{Total20}$.

In one embodiment, individual resistance $R_{f20}$ of the each filament may be obtained from total resistance $R_{Total20}$ using filament attributes 312 as shown in block 310. Filament attributes 312 may include total number of filaments in parallel NP and total number of filaments in series NS. The individual cold resistance $R_{f20}$ may be calculated by:

$$R_{f20}=R_{total\,20}*NP/NS \quad \text{Equation 5}$$

The temperature monitoring mechanism 300 may include a real resistance monitor 314. The real time resistance monitor 314 calculates the resistance of the filament during operation when the filaments are being heated. The calculation may be performed by monitoring the current and voltage of the power supply during operation at predetermined time intervals. In one embodiment, the real time resistance monitor 314 provides a resistance of a filament assembly $R_{Total}$. Individual real time resistance $R_f$ of each filament may be calculated by:

$$R_f=R_{total}*NP/NS. \quad \text{Equation 6}$$

The temperature monitoring mechanism 300 includes a temperature calculation block 318. The temperature calculation block 318 may calculate the operation temperature T of the filament using the real time resistance $R_f$, the cold resistance $R_{f20}$ at 20° C. and the temperature-resistance relationship 312. In one embodiment, when the temperature-resistance relationship 312 includes a linear approximation, the real time temperature may be calculated by:

$$T=20+(R_f-R_{f20})/\alpha. \quad \text{Equation 7}$$

Alternatively, a different temperature T' within a known corresponding resistance $R_{fT'}$ may be used for calculating the real time temperature:

$T=T'+(R_f-R_{fT'})/\alpha.$  Equation 8

Figure 4:
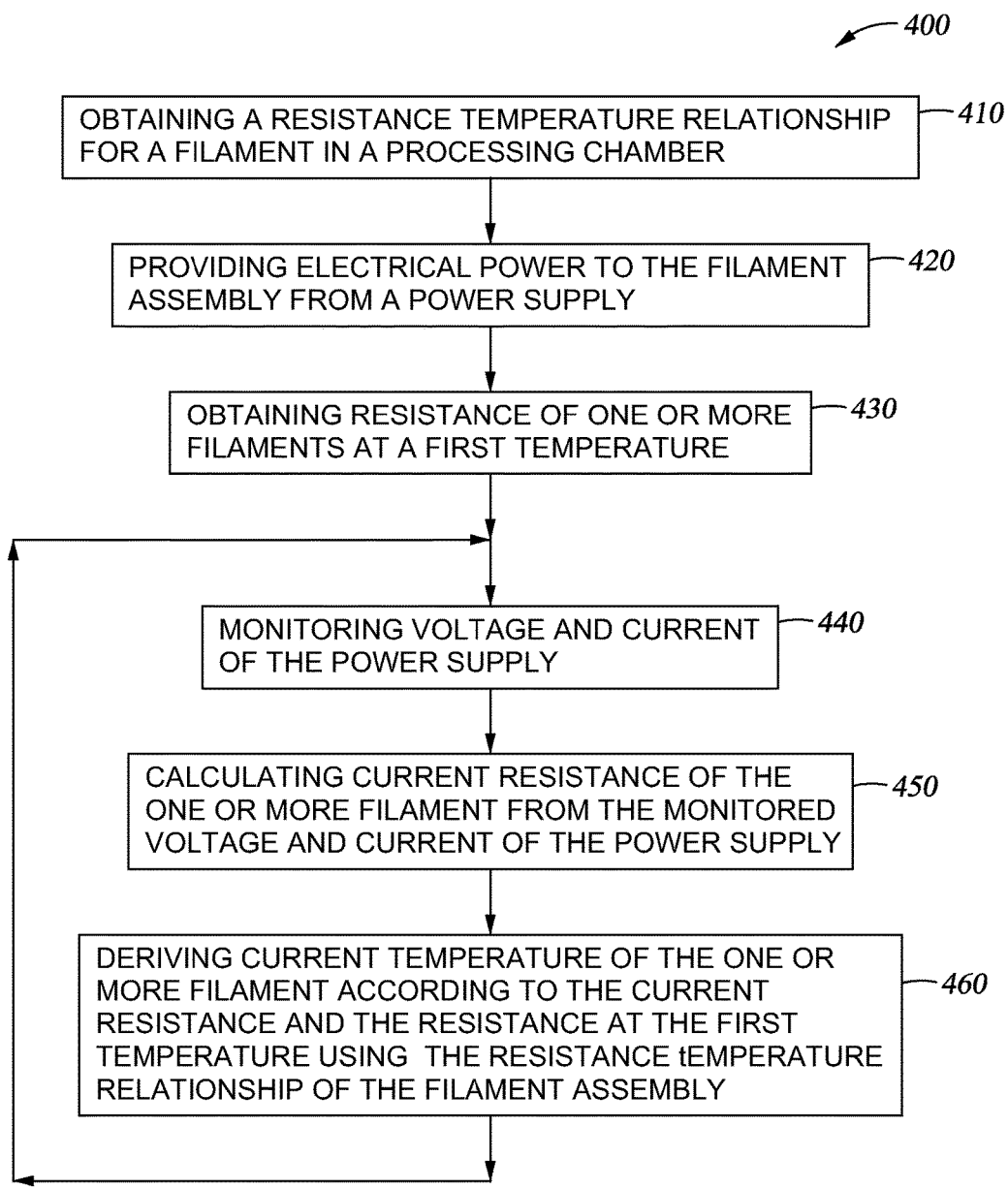
FIG. 4 is a flow chart of a method for hotwire filament temperature control according to one embodiment of the present disclosure.

FIG. 4 is a flow chart of a method 400 for hotwire filament temperature control according to one embodiment of the present disclosure.

In Box 410, a resistance-temperature relationship of a filament assembly or individual filament in a processing chamber may be obtained. The resistance-temperature relationship may be obtained by experiments or an initiation process. In one embodiment, the resistance-temperature relationship may be in the form of an experimental value of the temperature coefficient $\alpha$ for the filament assembly or the individual filament being observed. Alternatively, the resistance-temperature relationship may be in the form of look-up table, or other mathematical models.

In Box 420, electrical power is applied to the filament assembly being measured. Prior to applying the electrical power, the filament assembly is "cold" at room temperature, for example close to 20° C.

In Box 430, a resistance of the filament assembly or individual filament is measured. In one embodiment, the resistance of the filament assembly or individual filament is measured as soon as the power supply is applied to the filament assembly so that the filament assembly or individual filament still remain substantially the "cold" room temperature. The resistance may be measured by measuring the current and voltage of the power supply immediately after powering up the filament assembly and calculated using Equation 1 from the measured current and voltage value. Equation 5 may be used to resistance of individual filament. In one embodiment, the calculated resistance under the "cold" temperature may be compared to a theoretical resistance $R_0$ according to Equation 4 to determine whether the resistances of the filaments have drifted after time, for example due to changes in geometry of the filaments over time. The "cold" temperature measurement may be periodically performed to reduce temperature measurement error caused by change in the filaments.

In Box 440-460, real time temperature of the filament assembly or individual filament may be measured periodically. In Box 440, the voltage and current of the power supply are measured. In Box 450, the current resistance of the filament assembly or individual filament may be calculated in the same manner as described in Box 430. In Box 460, the current temperature of the filament assembly or individual filament may be derived according to the current resistance, a known resistance under a known temperature, and the resistance-temperature relationship obtained in Box 410, for example using Equation 7 or Equation 8. In one embodiment, the resistance under the "cold" temperature measured in Box 430 may be used as the known resistance.

Figure 5:
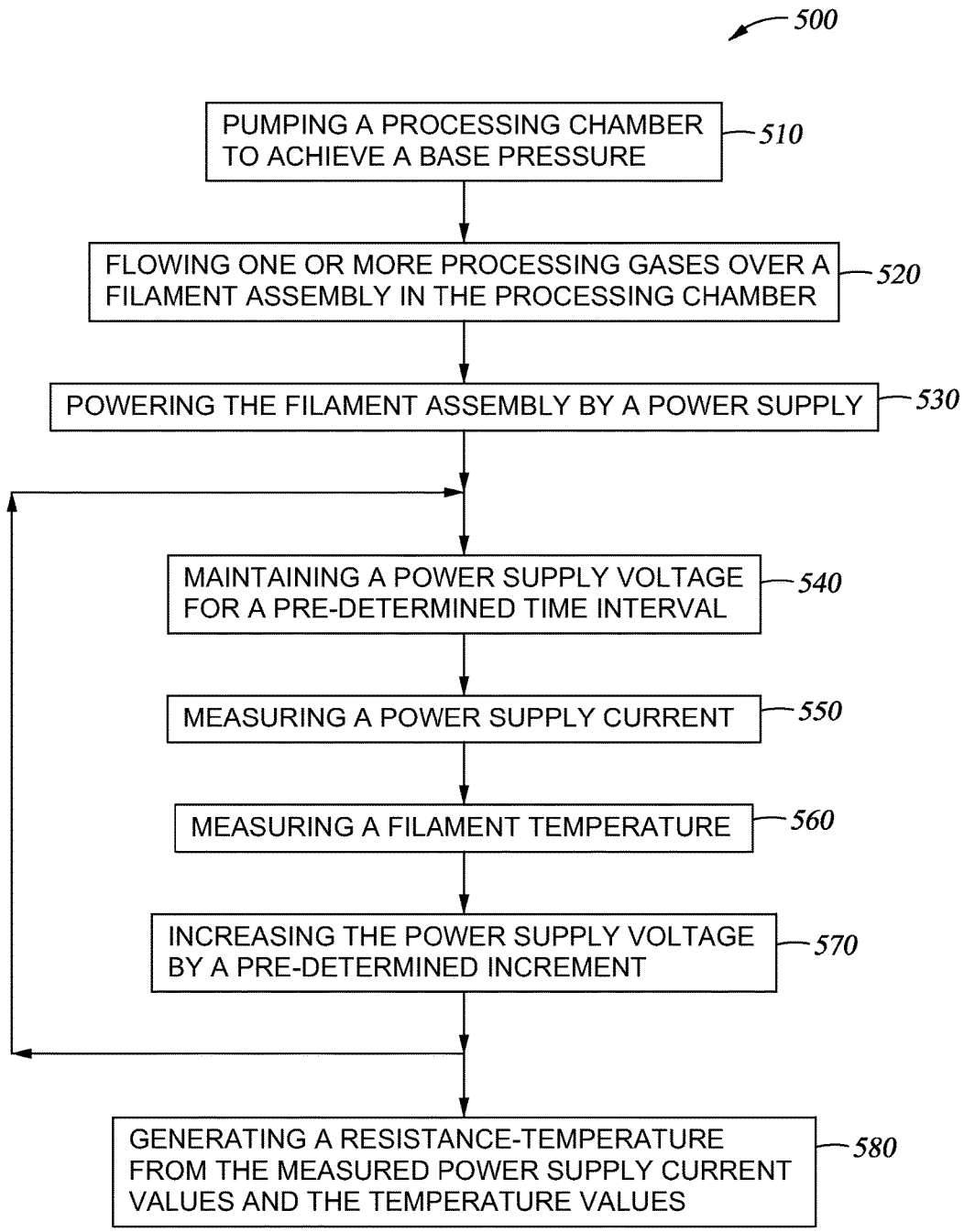
FIG. 5 is a flow chart of a method for obtaining a temperature-resistance relationship according to one embodiment of the present disclosure.

FIG. 5 is a flow chart of a method 500 for obtaining a resistance-temperature relationship according to one embodiment of the present disclosure. The method 500 may be used to generate the resistance-temperature relationship in Box 410 of the method 400. The method 500 may be performed prior to performing a particular process in a hotwire processing chamber to generate a resistance-temperature relationship for the filament assembly under the processing conditions of the particular process so that real time temperature of the filament assembly can be monitored and controlled.

In Box 510, the hotwire processing chamber is pumped down to a vacuum level as a base pressure for the process to be performed. In Box 520, one or more processing gases for the process to be performed may be flown to the processing chamber now under the base pressure.

In Box 530, electrical power, for example, DC power, may be applied to the filament assembly in the processing chamber which is now under the base pressure and having the processing gases flowing through. In one embodiment, a low voltage may be applied to the filament assembly in Box 530 so that the filament assembly only reaches a low temperature.

In Box 540, the voltage of the power supply is maintained at a pre-determined time period. The pre-determined time period may be selected to be a time period long enough for the filament assembly to reach steady state under the voltage being maintained. In one embodiment, the pre-determined time period may be between about 20 seconds to about 1 minute.

In Box 550, the current of the power supply may be measured after the voltage has been maintained for the pre-determined time period. The measured current may be used to calculate the resistance of the filament assembly or individual filament according to Equation 1.

In Box 560, the temperature of the filament assembly or individual filament may be measured using a temperature sensor after the voltage has been maintained for a pre-determined time period. The temperature sensor may be any suitable sensors. In one embodiment, the temperature sensor may be a thermocouple. The current and temperature may be measured simultaneously.

In Box 570, the voltage of the power supply may be increased by a predetermined increment to a next voltage level so that another resistance-temperature pair can be measured. In one embodiment, the predetermined increment may be between about 5 volts to about 10 volts.

Boxes 540-570 may be repeated to cover the entire operation range of the filament assembly for the process to be performed.

In Box 580, a resistance-temperature relationship may be generated from the resistance-temperature pairs measured in Boxes 540-570. As discussed above, the resistance-temperature relationship may be a look-up table or a mathematical model, such as a linear model as Equation 3.

While the foregoing is directed to embodiments of the present disclosure, other and further embodiments of the disclosure may be devised without departing from the basic scope thereof, and the scope thereof is determined by the claims that follow.

The invention claimed is:
1. A method for semiconductor processing, comprising:
performing a chemical vapor deposition process or an etch process on a substrate in a hotwire processing chamber by:
flowing a processing gas over a filament assembly in the hotwire processing chamber, wherein the filament assembly is powered by a power supply to heat the processing gas;
obtaining a resistance at a first temperature comprising:
applying a voltage level using the power supply;
measuring a voltage feedback and a current feedback of the power supply immediately after an electrical power is applied to the filament assembly;
maintaining the voltage level until the filament assembly reaches a steady state; and
measuring a voltage feedback and a current feedback of the power supply at the steady state; and
monitoring a real time temperature of the filament assembly comprising:

monitoring a real time voltage and a real time current of the power supply connected to the filament assembly while the power supply provides electrical power to the filament assembly;

calculating a real time resistance of the filament assembly from the real time voltage and the real time current of the power supply; and determining the real time temperature of the filament assembly according to a real time resistance and a resistance-temperature relationship.

2. The method of claim 1, further comprising obtaining a temperature coefficient and a resistance of the filament assembly at a first temperature, wherein determining the real time temperature comprises calculating the real time temperature using the resistance at the first temperature and the temperature coefficient.

3. The method of claim 2, wherein obtaining the resistance of the first temperature comprises calculating a theoretical resistance of the filament assembly from filament material, geometries and configuration of the filament assembly.

4. The method of claim 2, wherein obtaining the resistance-temperature relationship comprises applying a plurality of voltage values to the filament assembly using the power supply, a sample resistance is calculated from the current feedback and the voltage value, and a sample temperature of the filament assembly is measured using a temperature sensor, and the resistance-temperature relationship is generated from the plurality of sample temperatures and same resistances corresponding to the plurality of voltage values.

5. The method of claim 3, further comprising: periodically, measuring a voltage feedback and a current feedback of the power supply immediately after the electrical power is applied to the filament assembly;

calculating a cold resistance from the voltage feedback and current feedback; and comparing the cold resistance and the theoretical resistance to determine whether a correction to the theoretical resistance is needed.

6. The method of claim 4, wherein the plurality of voltage values increases from low to high.

7. The method of claim 4, further comprising, prior to applying the plurality of voltage values: pumping the processing chamber to a pressure level similar to a process to be performed.

8. The method of claim 7, further comprising flowing one or more processing gases according to the process to be performed to the processing chamber while applying the plurality of voltage values.

9. The method of claim 1, wherein the resistance-temperature relationship is a look up table.

10. The method of claim 1, further comprising: upon determining the real time temperature of the filament assembly, determining a temperature error from the real time temperature and a target temperature for the chemical vapor deposition process or the etch process; and adjust at least one of voltage and current supplied to the filament assembly to correct the temperature error.

11. A hotwire processing chamber, comprising:

a chamber body defining an internal processing volume;

a filament assembly disposed in the internal processing volume;

a power supply coupled to the filament assembly; and a temperature controller coupled to the power supply to facilitate a chemical deposition process or an etching process using the filament assembly as a heat source, wherein the temperature controller obtains a resistance-temperature relationship by performing the following operation for a plurality of temperatures:

applying a voltage level using the power supply;

measuring a voltage feedback and a current feedback of the power supply immediately after an electrical power is applied to the filament assembly;

maintaining the voltage level until the filament assembly reaches a steady state at a corresponding temperature; and measuring a voltage feedback and a current feedback of the power supply at the steady state, monitors a real time voltage and a real time current of the power supply, calculates a real time resistance of the filament assembly from the real time voltage and the real time current of the power supply, and determines a real time temperature of the filament assembly according to the real time resistance and the resistance-temperature relationship.

12. The hotwire processing chamber of claim 11, wherein the temperature controller further sends control signals to the power supply according to the real time temperature of the filament assembly.

13. The hotwire processing chamber of claim 11, further comprising a filament integrity monitor coupled to the power supply, wherein the filament integrity monitor observes changes in the voltage feedback or the current feedback of the power supply and determines whether there is a filament breakage according to slope and/or magnitude of the changes in the voltage feedback or the current feedback.

14. The hotwire processing chamber of claim 11, further comprising a system controller, wherein the temperature controller is connected to the system controller.

15. The hotwire processing chamber of claim 11, wherein the temperature controller is a software module in a system controller.

* * * * *

UNITED STATES PATENT AND TRADEMARK OFFICE
CERTIFICATE OF CORRECTION

PATENT NO. : 10,209,136 B2
APPLICATION NO. : 14/501902
DATED : February 19, 2019
INVENTOR(S) : Paul Steffas It is certified that error appears in the above-identified patent and that said Letters Patent is hereby corrected as shown below:

On the Title Page

In the illustrative figure, Reference Numeral 460, Line 4, "tEMPERATURE" should read -- TEMPERATURE --.

In the Drawings

On Sheet 4 of 5, in Figure 4, Reference Numeral 460, Line 4, delete "tEMPERATURE" and insert -- TEMPERATURE --, therefor.

In the Specification

In Column 4, Line 33, delete "(C.)" and insert -- (° C.) --, therefor.

In Column 6, Line 13, delete "a" and insert -- α --, therefor.

In Column 6, Line 42, delete "$R_{total20}*NP/NS$" and insert -- $R_{total20}*NP/NS$. --, therefor.

In Column 6, Line 54, delete "$R_f\text{-}R_{total}*NP/NS$." and insert -- $R_f=R_{total}*NP/NS$. --, therefor.

Signed and Sealed this
Thirtieth Day of April, 2019

Andrei Iancu
*Director of the United States Patent and Trademark Office*